US009560722B2

(12) United States Patent
Yue et al.

(10) Patent No.: US 9,560,722 B2
(45) Date of Patent: Jan. 31, 2017

(54) POWER SYSTEM-ON-CHIP ARCHITECTURE

(71) Applicant: The Hong Kong University of Science and Technology, Hong Kong (CN)

(72) Inventors: Chik Patrick Yue, Hong Kong (CN); Johnny Kin On Sin, Hong Kong (CN); Kei May Lau, Hong Kong (CN)

(73) Assignee: The Hong Kong University of Science and Technology, Hong Kong (CN)

( * ) Notice: Subject to any disclaimer, the term of this patent is extended or adjusted under 35 U.S.C. 154(b) by 0 days.

(21) Appl. No.: 14/779,853

(22) PCT Filed: Mar. 25, 2014

(86) PCT No.: PCT/CN2014/000324
§ 371 (c)(1),
(2) Date: Sep. 24, 2015

(87) PCT Pub. No.: WO2014/154023
PCT Pub. Date: Oct. 2, 2014

(65) Prior Publication Data
US 2016/0323968 A1 Nov. 3, 2016

Related U.S. Application Data

(60) Provisional application No. 61/852,933, filed on Mar. 25, 2013.

(51) Int. Cl.
*H01L 25/16* (2006.01)
*H05B 37/02* (2006.01)
(Continued)

(52) U.S. Cl.
CPC .......... *H05B 37/0227* (2013.01); *F21V 5/004* (2013.01); *F21V 9/00* (2013.01); *F21V 29/70* (2015.01);
(Continued)

(58) Field of Classification Search
CPC ........ H01L 25/167; H01L 33/32; H01L 33/52; H01L 33/58; H01L 33/62
(Continued)

(56) References Cited

U.S. PATENT DOCUMENTS 6,646,491 B2   11/2003   Worley, Sr. et al.
8,272,757 B1 *  9/2012   Fan ..................... H01L 25/0753
                                                         257/778
(Continued)

FOREIGN PATENT DOCUMENTS

CN   101154656 A   4/2008
CN   102403309 A   4/2012

OTHER PUBLICATIONS

Araghchini, M., et al., "A Technology Overview of the PowerChip Development Program," *IEEE Transactions on Power Electronics*, vol. 28, No. 9, pp. 4182-4201, (Sep. 2013).
(Continued)

Primary Examiner — Tung X Le
(74) Attorney, Agent, or Firm — Leydig, Voit & Mayer, Ltd.

(57) ABSTRACT

A lighting device is provided. The lighting device includes a substrate, integrated circuits (22', 24), embedded passive components (26, 27), and a lighting component (22), the device being arranged in an architecture having three layers: an integrated circuits layer (11) including the integrated circuits (22', 24), wherein the integrated circuits layer (11) is integrated on a first side of the substrate; an embedded passive components layer (12) including the embedded passive components (26, 27), wherein the embedded passive components (26, 27) are embedded in grooves formed in the substrate and wherein the embedded passive components are connected to the integrated circuits (22', 24) through vias (28) in the substrate; and a bonded layer (13), including the lighting component (22), the lighting component (22) being
(Continued)

connected to the integrated circuit layer (11) through flip-chip bonding or monolithic integration.

20 Claims, 18 Drawing Sheets

(51) Int. Cl.

| | |
|---|---|
| *H01L 33/52* | (2010.01) |
| *H01L 33/62* | (2010.01) |
| *F21V 29/70* | (2015.01) |
| *F21V 5/00* | (2015.01) |
| *F21V 9/00* | (2015.01) |
| *G08G 1/07* | (2006.01) |
| *H01L 21/48* | (2006.01) |
| *H01L 23/498* | (2006.01) |
| *H01L 25/075* | (2006.01) |
| *H01L 33/00* | (2010.01) |
| *H01L 33/32* | (2010.01) |
| *H01L 33/54* | (2010.01) |
| *H01L 33/58* | (2010.01) |
| *H01L 33/64* | (2010.01) |
| *H05B 33/08* | (2006.01) |
| *H01L 27/15* | (2006.01) |
| *F21W 131/103* | (2006.01) |

(52) U.S. Cl.
CPC ............... *G08G 1/07* (2013.01); *H01L 21/486* (2013.01); *H01L 23/49827* (2013.01); *H01L 25/0753* (2013.01); *H01L 25/16* (2013.01); *H01L 25/167* (2013.01); *H01L 27/153* (2013.01); *H01L 33/0075* (2013.01); *H01L 33/32* (2013.01); *H01L 33/52* (2013.01); *H01L 33/54* (2013.01); *H01L 33/58* (2013.01); *H01L 33/62* (2013.01); *H01L 33/642* (2013.01); *H05B 33/0854* (2013.01); *H05B 37/0218* (2013.01); *H05B 37/0272* (2013.01); *F21W 2131/103* (2013.01); *F21Y 2115/10* (2016.08); *H01L 27/156* (2013.01); *H01L 2224/16* (2013.01); *H01L 2933/005* (2013.01); *H01L 2933/0058* (2013.01); *H01L 2933/0066* (2013.01); *H01L 2933/0075* (2013.01)

(58) Field of Classification Search
USPC .......................................................... 257/98
See application file for complete search history.

(56) References Cited

U.S. PATENT DOCUMENTS

| | | | |
|---|---|---|---|
| 2006/0163589 A1* | 7/2006 | Fan | H01L 27/153 |
| | | | 257/88 |
| 2013/0032826 A1 | 2/2013 | Kuo et al. | |
| 2014/0264410 A1* | 9/2014 | Lin | H01L 25/167 |
| | | | 257/98 |

OTHER PUBLICATIONS

Kline, M., et al., "A Transformerless Galvanically Isolated Switched Capacitor LED Driver," in *2012 Twenty-Seventh Annual IEEE Applied Power Electronics Conference and Exposition (APEC)*, Feb., pp. 2357-2360.

Lau, Kei May, et al., "Cost-Effective and Eco-friendly LED System-on-a-Chip", *The 10th China International Forum on Solid State Lighting*, Beijing China (Nov. 2013).

"Metacapacitors™: Next Generation Power Electronics for LED Lighting and Other Application", *CUNY Energy Institute*, pp. 1-10.

"Solid State Lighting Research and Development: Manufacturing Roadmap (2012)", *U.S. Department of Energy*, Aug. 2012, (93 pages total).

International Search Report from parent PCT application No. PCT/CN2014/000324, dated Jun. 11, 2014 (total 2 pages).

* cited by examiner

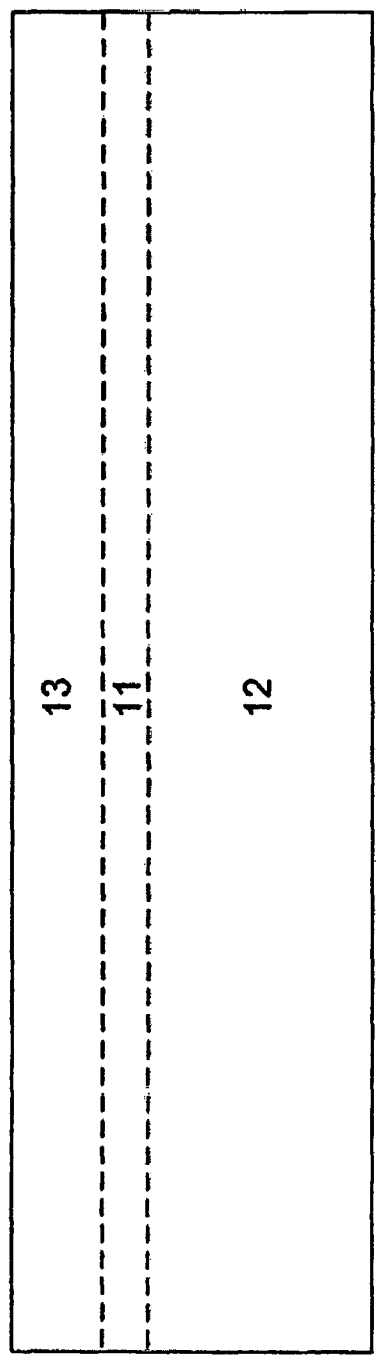

POWER SYSTEM-ON-CHIP ARCHITECTURE

CROSS-REFERENCE TO RELATED APPLICATIONS

This patent application is the U.S. national phase of International Patent Application No. PCT/CN2014/000324, filed Mar. 25, 2014, which claims the benefit of U.S. Provisional Patent Application No. 61/852,933, filed Mar. 25, 2013, both of which are incorporated by reference in their entireties.

FIELD

Embodiments of the invention relate to a power system-on-chip architecture. Particularly, a structure and platform that integrates solid state lighting, signal processing, control circuits, semiconductor power switches, and passive components is discussed herein, as well as exemplary applications.

BACKGROUND

Solid state lighting (SSL) technology (such as light emitting diodes (LEDs)) is promising for lighting, illumination and display applications. Due to higher efficiency and longer life time compared with conventional incandescent and fluorescent lamps, costs of electricity consumption, replacement costs and maintenance costs can be significantly reduced by using SSL. Also, by using signal processing and control circuits to directly control pixels in an SSL display, the SSL technology may find wide applications in micro-display, projection display and other areas to achieve high performance, high efficiency and eco-friendly systems.

However, conventional solid state lightings have two critical issues: they are relatively expensive and bulky. Taking LED bulbs as an example, the price of LED bulbs can be many times more expensive than competing fluorescent bulbs. The top two contributors to the cost of LED bulbs are LED packaging and the driver module. A further drawback is that the driver module occupies a large volume. Typically, the circuit board for the driver module includes a power transformer, a power switch, several capacitors, and a controller. Further, passive components (transformer, capacitor) of the driver module also occupy a large volume (the large volume of the transformer is due to the reason that the offline voltage is relatively high (110 VAC~220 VAC), so at tens of kHz range, the required inductance value of the transformer is large). These bulky driver circuits severely limit the application of SSL in applications where compactness is important.

SUMMARY

Embodiments of the invention provide a power system-on-chip architecture suitable for SSL lighting and display applications that is cost-effective and compact. The architecture includes three layers with different functions: 1) an integrated circuits layer, 2) an embedded passive components layer, and 3) a bonded layer. These layers are interconnected and integrated in an efficient manner so that the cost and volume of the device is minimized.

BRIEF DESCRIPTION OF THE SEVERAL VIEWS OF THE DRAWINGS

FIG. 1 is a diagram depicting an overall conceptual schematic of an embodiment of the invention.

DETAILED DESCRIPTION

In general terms, embodiments of the invention relate to an architecture having a layered structure. In this structure, the architecture includes three different parts.

First, a substrate is used to build signal processing and control circuits as well as power management control circuits. It will be appreciated that the signal processing and control circuits and power management control circuits can be fabricated on the substrate using conventional IC fabrication process on a front side of the substrate. These signal processing and control circuits and power management control circuits on the front side of the substrate make up what is referred to herein as the integrated circuits layer.

Second, the substrate can accommodate passive components, including inductors, transformers, and capacitors, for example, on a back side of the substrate. These passive components are embedded at the backside of the substrate and connected to the front side of the substrate (the integrated circuits layer) through vias. By this embedded approach, the volume of the substrate (e.g., a silicon substrate) is efficiently utilized and the size of the device is minimized. The embedded passive components on the back side of the substrate make up what is referred to herein as the embedded passive component layer.

Third, the substrate also serves as an interposer: SSL devices/chips and semiconductor switches can be bonded to the substrate and connected with other components on the substrate by bonding technology, such as flip-chip bonding. These SSL devices/chips and semiconductor switches constitute what is referred to herein as the bonded layer.

The high level of integration offered by utilizing the substrate according to this architecture avoids the costs of material, assembly and discrete components, and the costs for testing and reworking of discrete components. The high level of integration also significantly reduces the volume of the device.

FIG. 1 is a diagram depicting an overall conceptual schematic of an embodiment of the invention. The depicted device has an architecture that is divided into three layers with different functions: an integrated circuits layer (11), an embedded passive components layer (12), and a bonded layer (13). The integrated circuits layer (11) includes, for example, signal processing circuits and control circuits for lighting and illumination. The embedded passive component layer (12) includes, for example, inductors, transformers and capacitors, as well as vias for connecting the embedded passive components with the integrated circuits layer (11). The bonded layer (13) includes SSL lighting components and/or other lighting components, as well as semiconductor power switches.

Figure 2A:
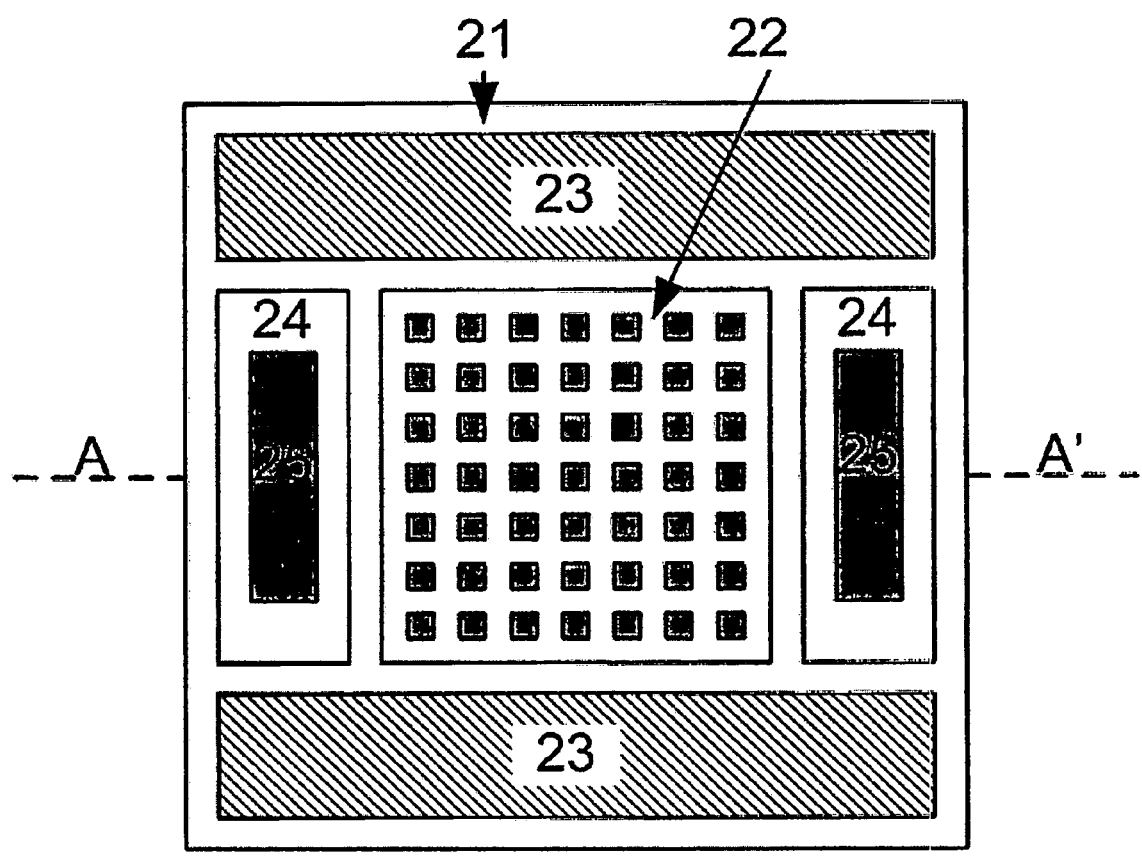
FIG. 2A is a diagram depicting a top view of an integrated power system-on-chip architecture of an exemplary device.

FIG. 2A is a diagram depicting a top view of an integrated power system-on-chip architecture of an exemplary device. A semiconductor is typically used for the substrate (21). The "front" (or "top") side of this substrate (21) includes a lighting component (22), which may be an SSL lighting/display component, signal processing and control circuits (23) for the lighting component, power management circuits (24), and semiconductor power switches for power conversion (25). In a particular example, the substrate (21) is silicon, the lighting component (22) is a GaN-based LED array, and the semiconductor power switches (25) are silicon-based power transistors or compound power transistors (e.g., GaN power transistors or SiC power transistors).

Compared with silicon-based power transistors, compound power transistor can work at higher frequencies for the same breakdown voltage. Therefore, by increasing the switching frequency of the converter in a power management module, the required inductance and capacitance values for the device can be reduced for ease of integration.

Figure 2B:
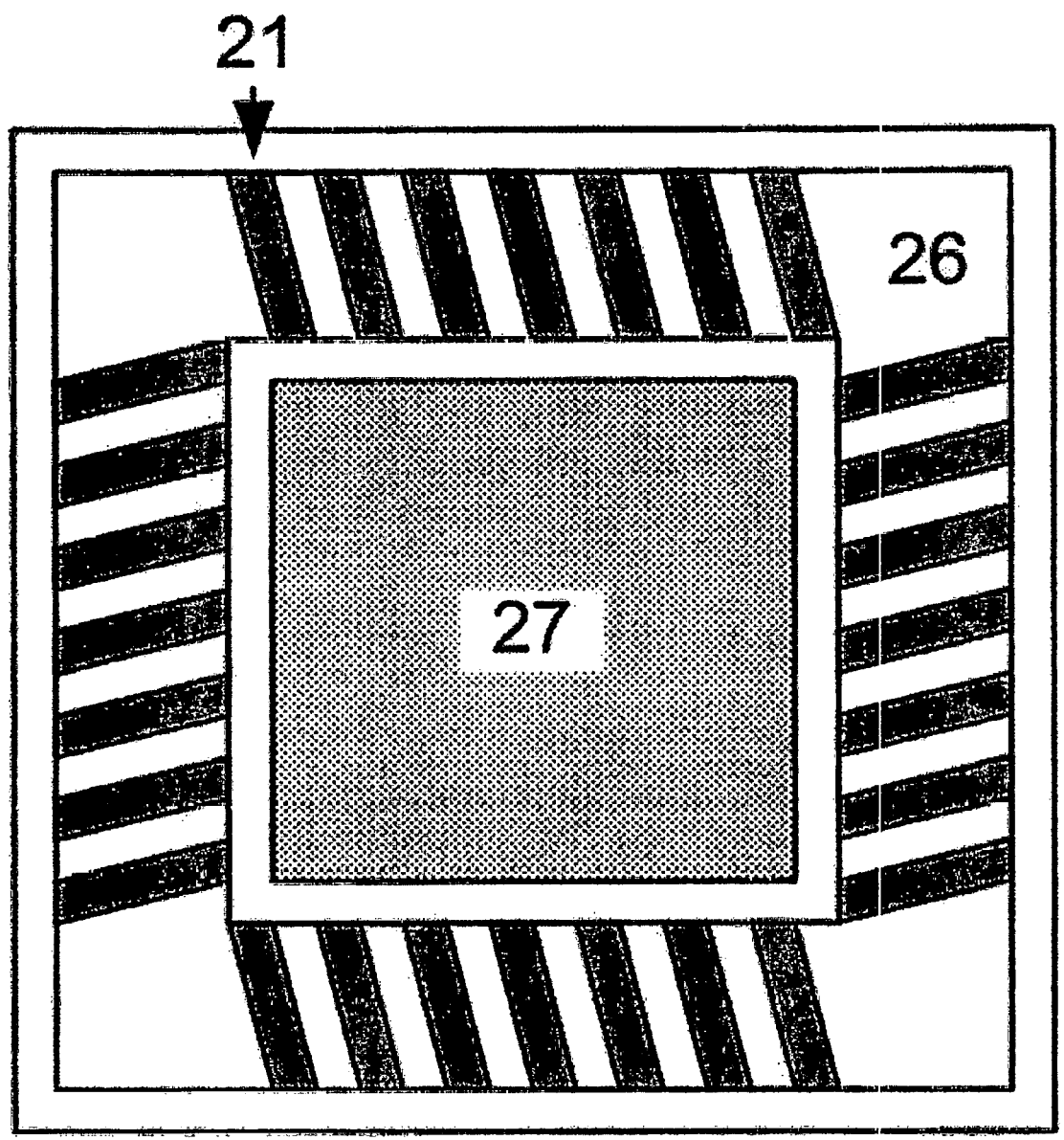
FIG. 2B is a diagram depicting a bottom view of an integrated power system-on-chip architecture of the exemplary device depicted in FIG. 2A.

FIG. 2B is a diagram depicting a bottom view of an integrated power system-on-chip architecture of an exemplary device. The "back" (or "bottom") side of the substrate (21) includes an embedded magnetic component (26) that includes transformers and inductors. The back side of the substrate (21) also include embedded capacitors (27).

Figure 2C:
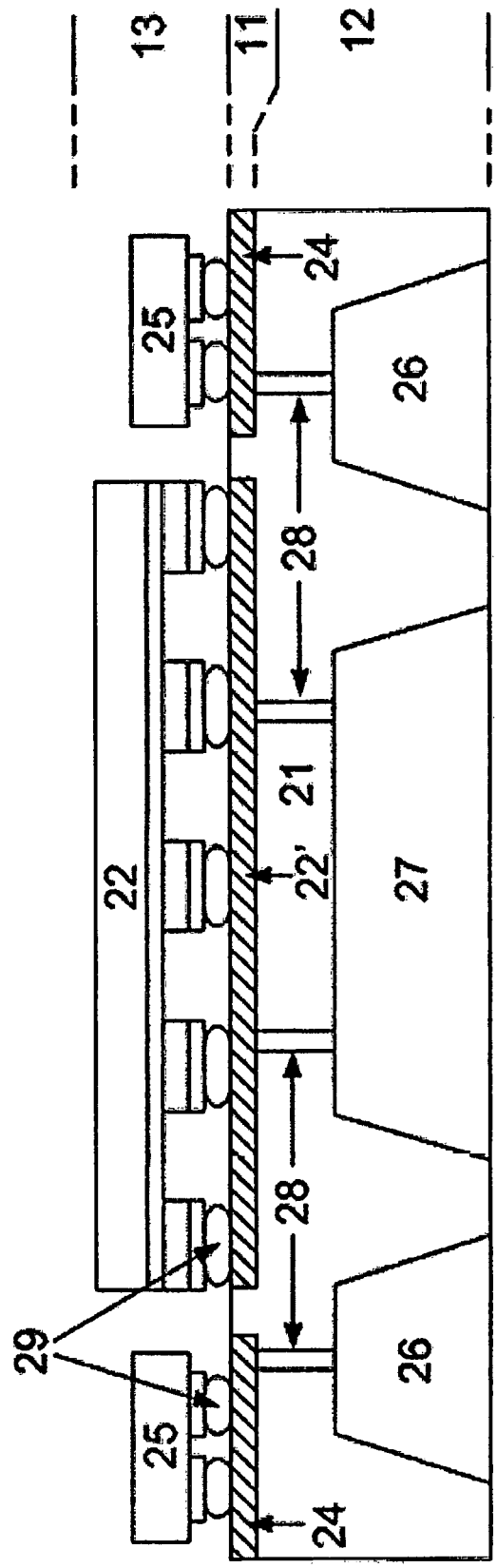
FIG. 2C is a diagram depicting a cross-sectional view (along cross-section line A-A' in FIG. 2A) of an integrated power system-on-chip architecture of the exemplary device depicted in FIG. 2A.

FIG. 2C is a diagram depicting a cross-sectional view (along cross-section line A-A' in FIG. 2A) of an integrated power system-on-chip architecture in an exemplary device. The three layers of the device can be seen in this depiction: the integrated circuits layer (11), the embedded passive components layer (12), and the bonded layer (13). The integrated circuits layer (11) includes signal processing and control circuits. These signal processing and control circuits include the signal processing and control circuits for the lighting component (shown in FIG. 2A as element (23) but not depicted in FIG. 2C), power management circuits (24), and matrix circuits (22') further used to control the lighting component (22). In an embodiment, the matrix circuits (22') are part of a driver circuit array capable of individually and modulating each pixel of the lighting component (22). The embedded passive components layer (12) includes embedded magnetic components (26) and capacitors (27). The architecture provides a large volume for placing the passive components in the substrate (21), making the integration of large inductance magnetic components (e.g., ~100 µH or more) and a high-density integrated capacitor feasible. The passive components are connected to the integrated circuits layer (11) through vias (28). As can be seen in FIG. 2C, the passive components do not consume valuable area on the front side of the substrate, and provide an ultra-compact architecture for the device. The bonded layer (13) includes the lighting component (22) (e.g., SSL lighting/display components) and semiconductor power switches (25). The components of the bonded layer (13) can be connected with the integrated circuits layer (11) through solder bumps (29).

It will be appreciated that FIGS. 2A-2C are illustrative of an exemplary embodiment of the invention and that the layout and composition of the various depicted components can be varied for other embodiments in various applications. Examples of some of these various other embodiments are depicted in FIGS. 3-7.

Figure 3:
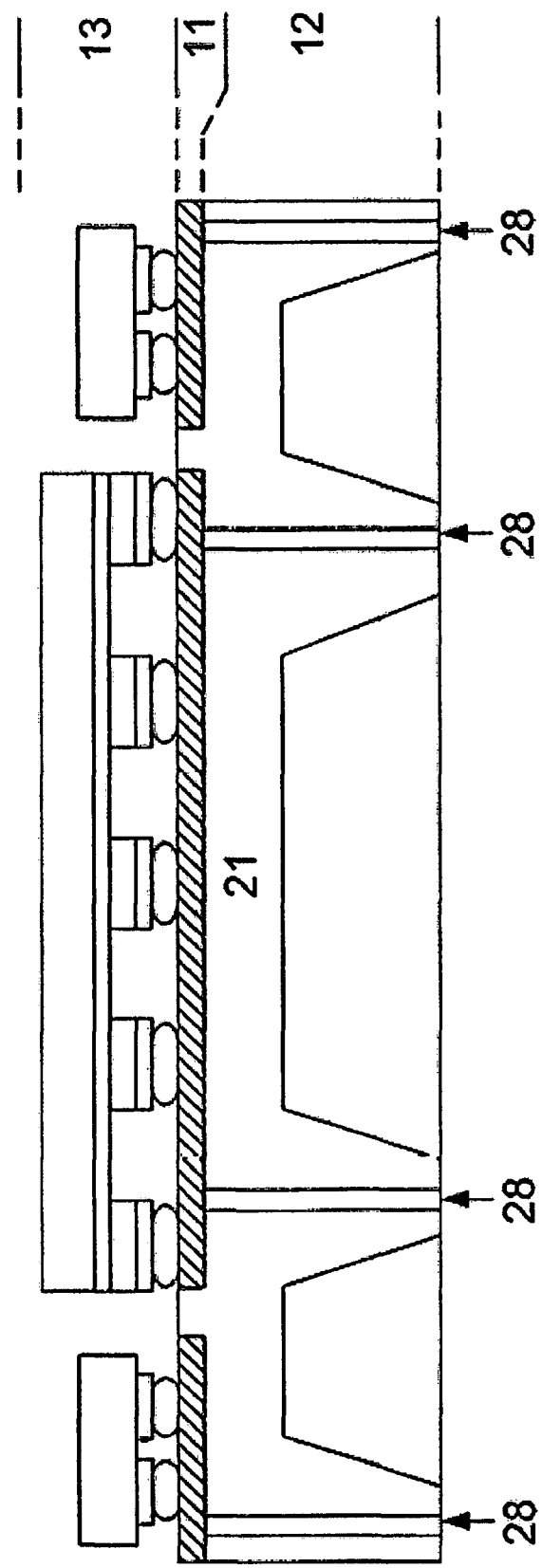
FIG. 3 is a diagram depicting a cross-sectional view of an integrated power system-on-chip architecture of another exemplary device.

FIG. 3 is a diagram depicting a cross-sectional view (similar to FIG. 2C) of an integrated power system-on-chip architecture of an exemplary device that is different from the exemplary device depicted in FIG. 2C. In the device depicted by FIG. 3, the vias (28) in the embedded passive components layer (12) connect the integrated circuits layer (11) to the back/bottom surface of the substrate (21) (instead of stopping at the top of the grooves for the passive components as depicted in FIG. 2C).

Figure 4:
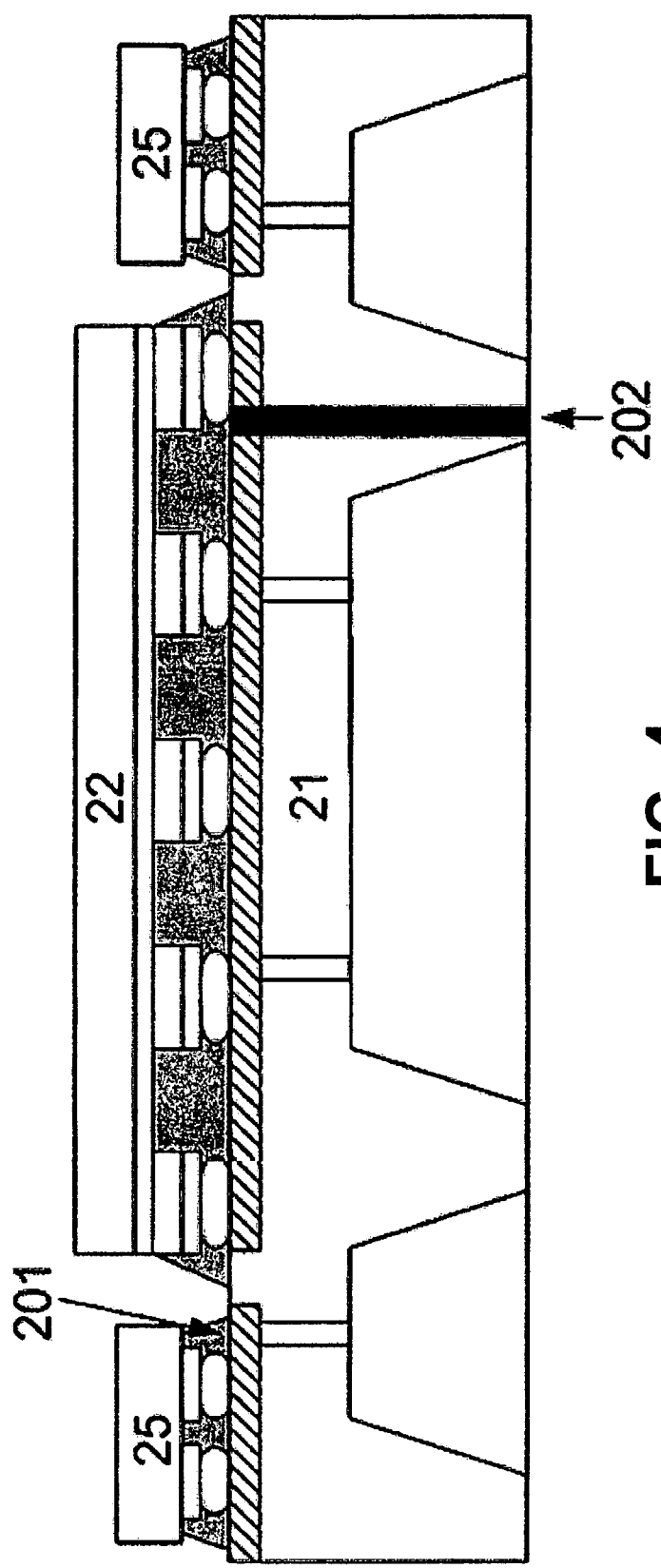
FIG. 4 is a diagram depicting a cross-sectional view of an integrated power system-on-chip architecture of yet another exemplary device.

FIG. 4 is a diagram depicting a cross-sectional view (similar to FIG. 2C) of an integrated power system-on-chip architecture of another exemplary device that is also different from the exemplary device depicted in FIG. 2C. In the device depicted by FIG. 4, supplementary structures are included. An under-fill (201) is provided between the components of the bonded layer (the semiconductor power switches (25) and lighting component (22)) and the components of the integrated circuit layer (11). The under-fill (201) enhances the mechanical reliability and heat dissipation for the components of the bonded layer. In one example, the underfill is a silica-coated aluminum nitride (SCAN). Additionally, a thermal routing structure (202) is incorporated in the substrate (21) for further improving the heat dissipation within the device.

Figure 5:
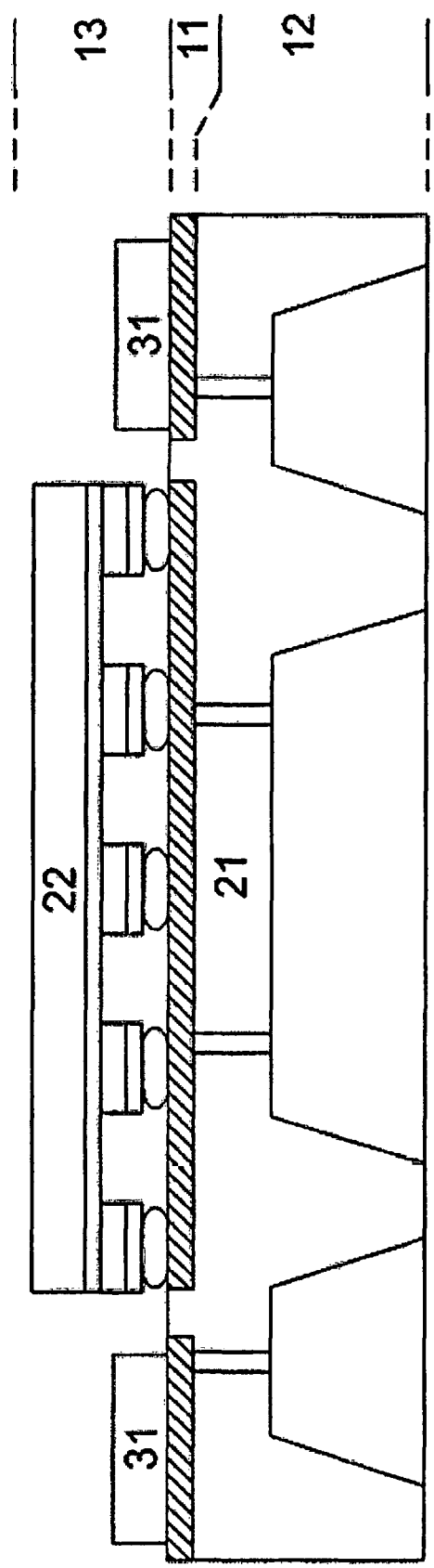
FIG. 5 is a diagram depicting a cross-sectional view of an integrated power system-on-chip architecture of yet another exemplary device.

FIG. 5 is a diagram depicting a cross-sectional view of an integrated power system-on-chip architecture of yet another exemplary device. In the exemplary device depicted in FIG. 5, semiconductor power switches (31) are monolithically integrated with the substrate (21) by an epitaxial process (rather than flip-chip bonded). The monolithically integrated semiconductor power switches (31) are still considered herein to be a part of the bonded layer (13).

Figure 6:
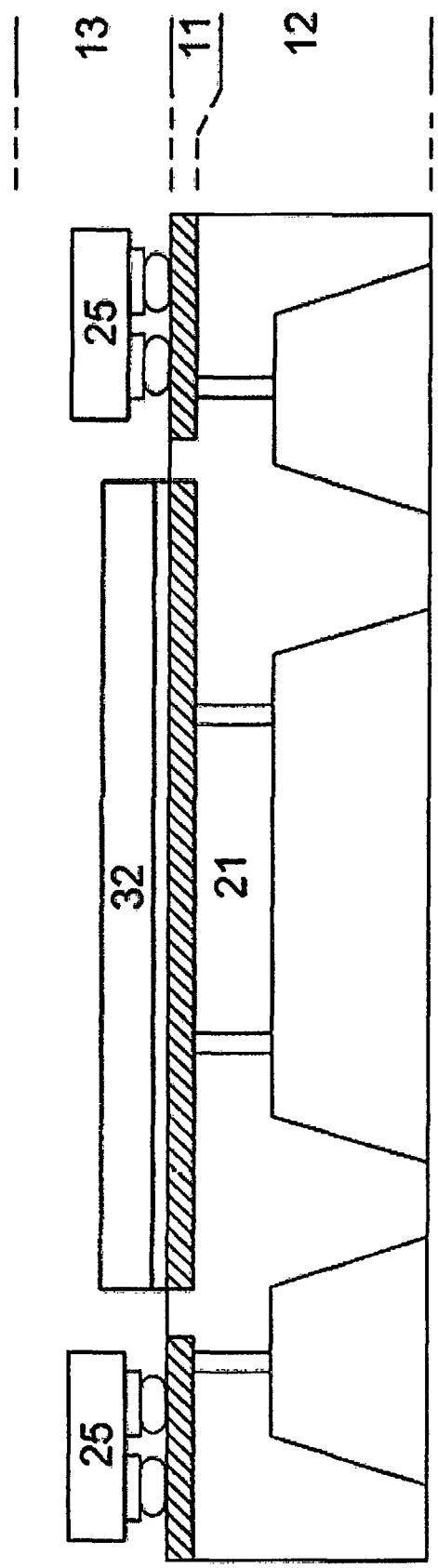
FIG. 6 is a diagram depicting a cross-sectional view of an integrated power system-on-chip architecture of yet another exemplary device.

FIG. 6 is a diagram depicting a cross-sectional view of an integrated power system-on-chip architecture of yet another exemplary device. In the exemplary device depicted in FIG. 6, a lighting component (32) is monolithically integrated with the substrate (21) by an epitaxial process (rather than flip-chip bonded). The monolithically integrated lighting component (32) is still considered herein to be a part of the bonded layer (13).

Figure 7:
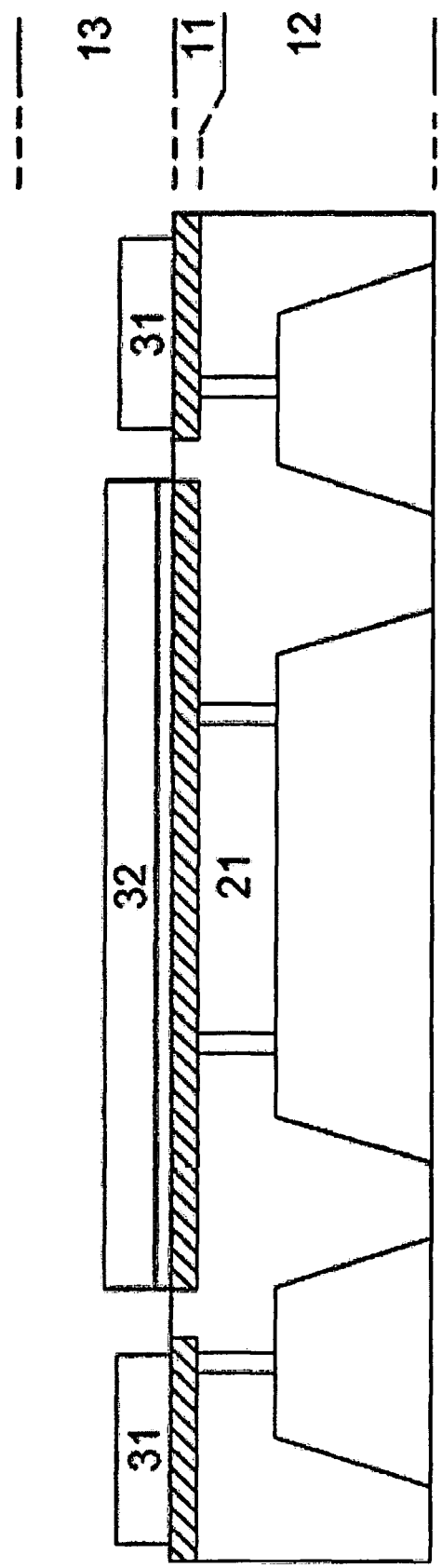
FIG. 7 is a diagram depicting a cross-sectional view of an integrated power system-on-chip architecture of yet another exemplary device.

FIG. 7 is a diagram depicting a cross-sectional view of an integrated power system-on-chip architecture of yet another exemplary device. In the exemplary device depicted in FIG. 7, both semiconductor power switches (31) and a lighting component (32) are monolithically integrated with the substrate (21) by an epitaxial process (rather than flip-chip bonded).

FIGS. 8A to 8G are diagrams depicting steps for fabricating a device having an integrated power system-on-chip architecture in accordance with an exemplary embodiment of the present invention.

Figure 8A:
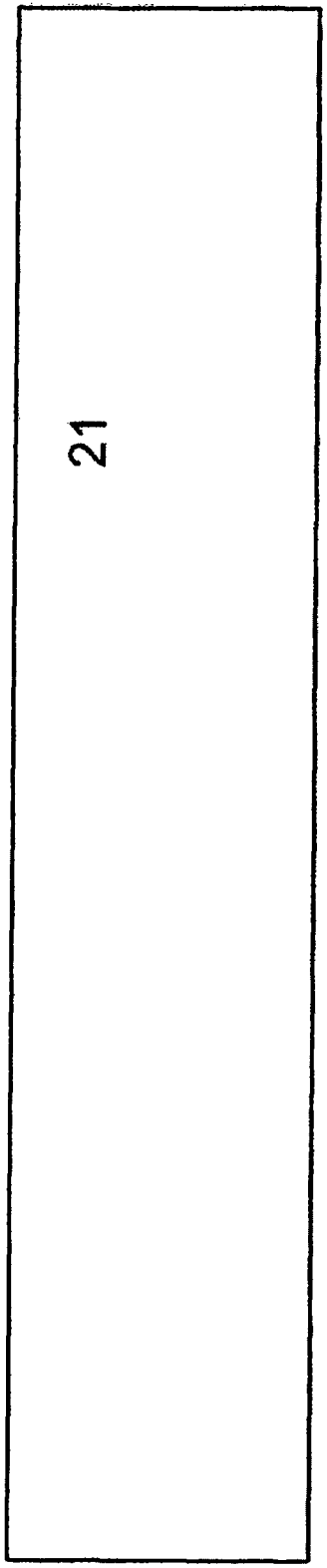
FIGS. 8A to 8G are diagrams depicting steps for fabricating a device having an integrated power system-on-chip architecture in accordance with an exemplary embodiment of the present invention.
Figure 8B:
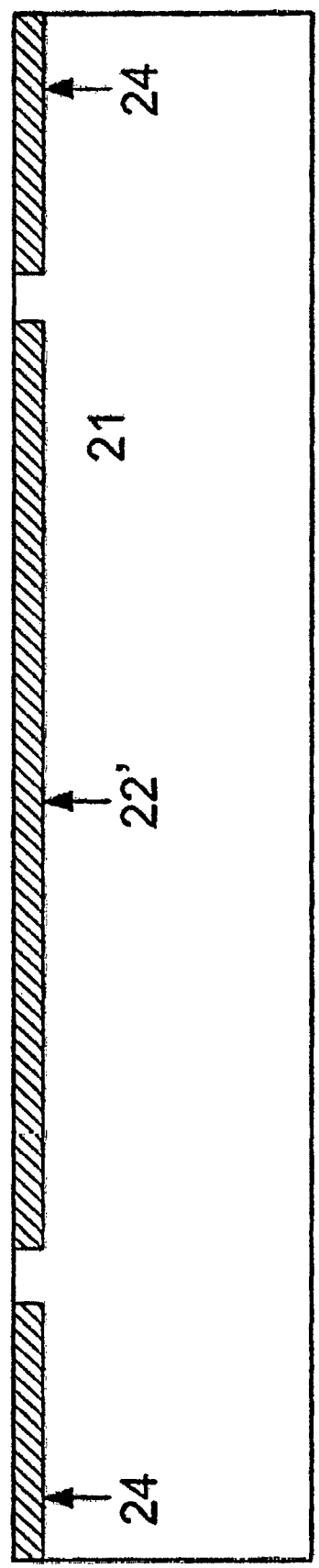
Figure 8C:
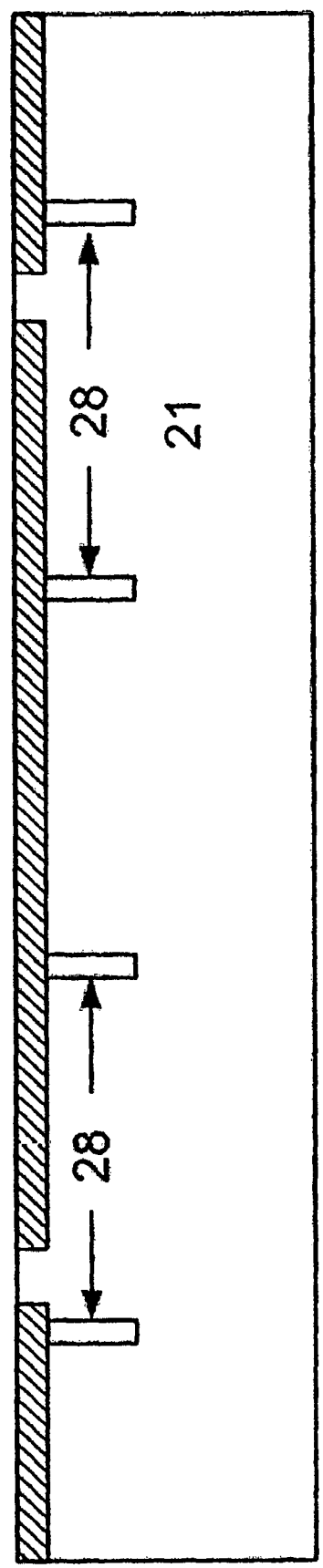

FIG. 8A illustrates the starting substrate (21). In an exemplary embodiment, the substrate is a single crystalline semiconductor, such as silicon. FIG. 8B illustrates the formation of integrated circuits for signal processing and power management control, including matrix circuits (22') and power management circuits (24). These circuits can be formed on the substrate (21) using conventional integrated circuits technologies. FIG. 8C illustrates the formation of vias in substrate (21). The vias can be fabricated using dry etching, such as a deep reactive-iron-etch (DRIE) process. The vias are then isolated from substrate (21) by deposited dielectric material. After that, the vias are filled with conductive material such as copper or highly doped polysilicon.

Figure 8D:
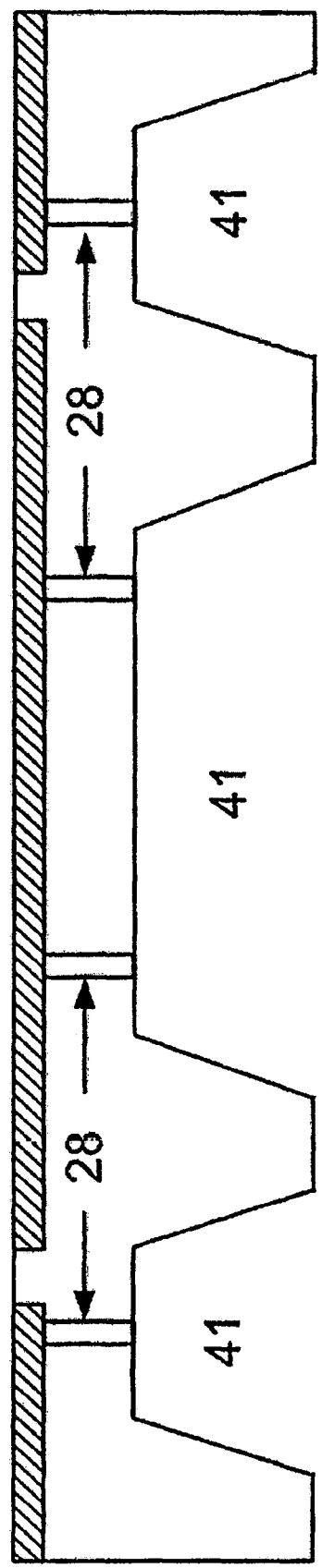
Figure 8E:
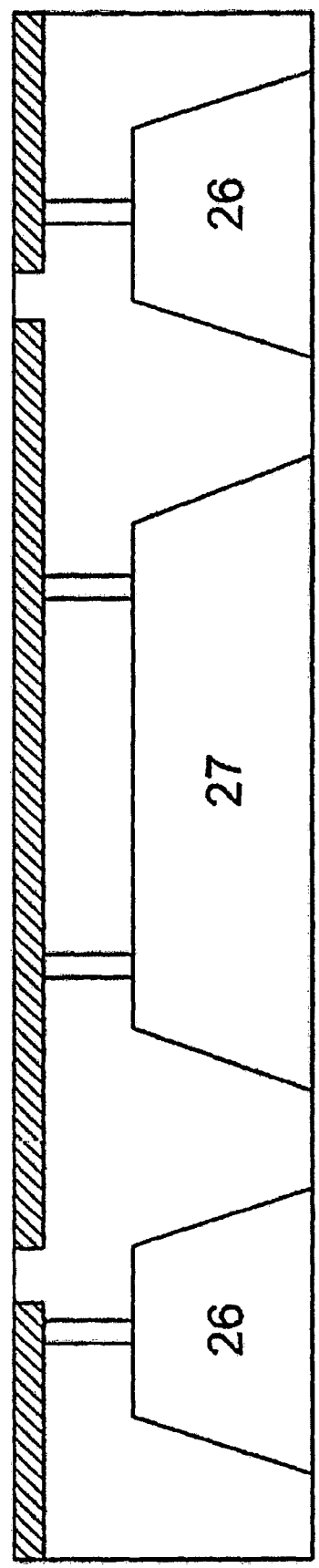

FIG. 8D illustrates the formation of grooves (41) in the backside of the substrate. The grooves are fabricated by etching. Both wet etching and dry etching can be used to form the grooves. For example, wet anisotropic etching (e.g., using TMAH or KOH) can be used to form grooves with sloped sidewall. Dry etching can be used to from grooves with a vertical sidewall. Gray-scale lithography can be used to form grooves with sidewalls having controllable slope. The depths of the groove formed in the substrate are large enough to expose the end of the vias (28). FIG. 8E illustrates the formation of passive components in the groove. The passive components includes magnetic components (26) (e.g., transformers, inductors) and capacitors (27). Since the volume of the groove is large, the inductance of integrated magnetic components (26) can be very large, and, for capacitors, the capacitance density can be significantly improved by utilizing the large available volume in the groove.

Figure 8F:
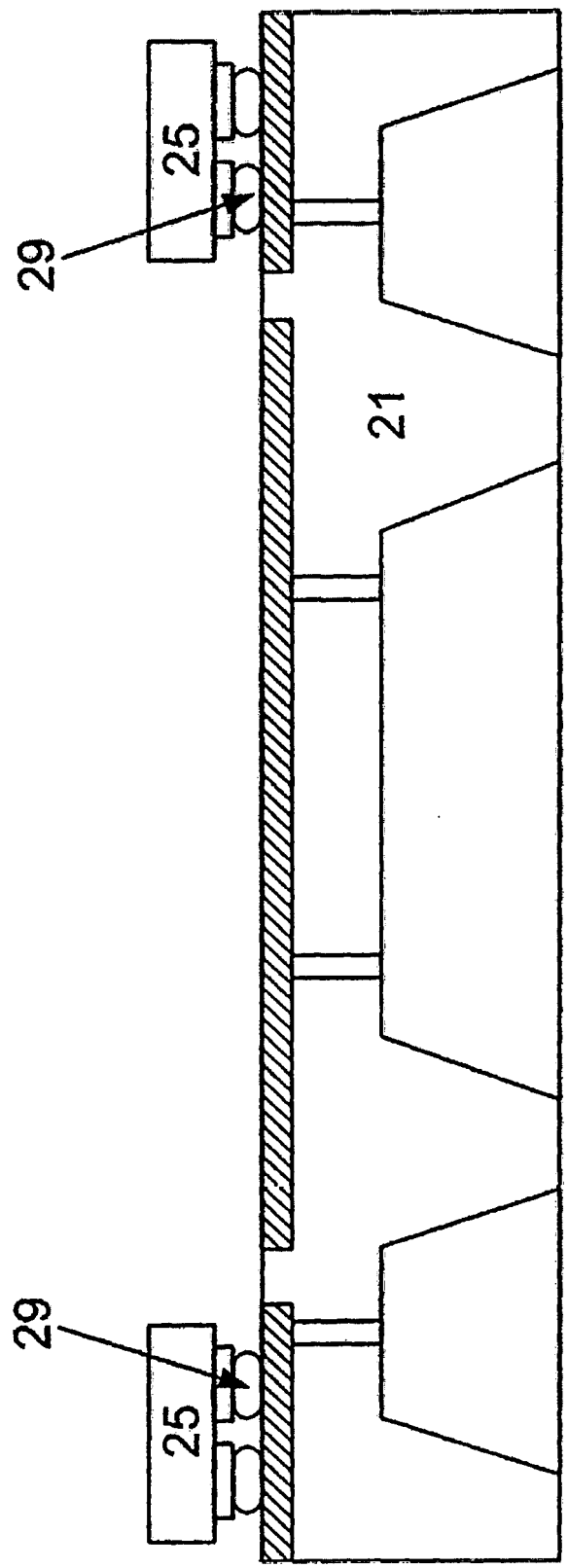
Figure 8G:
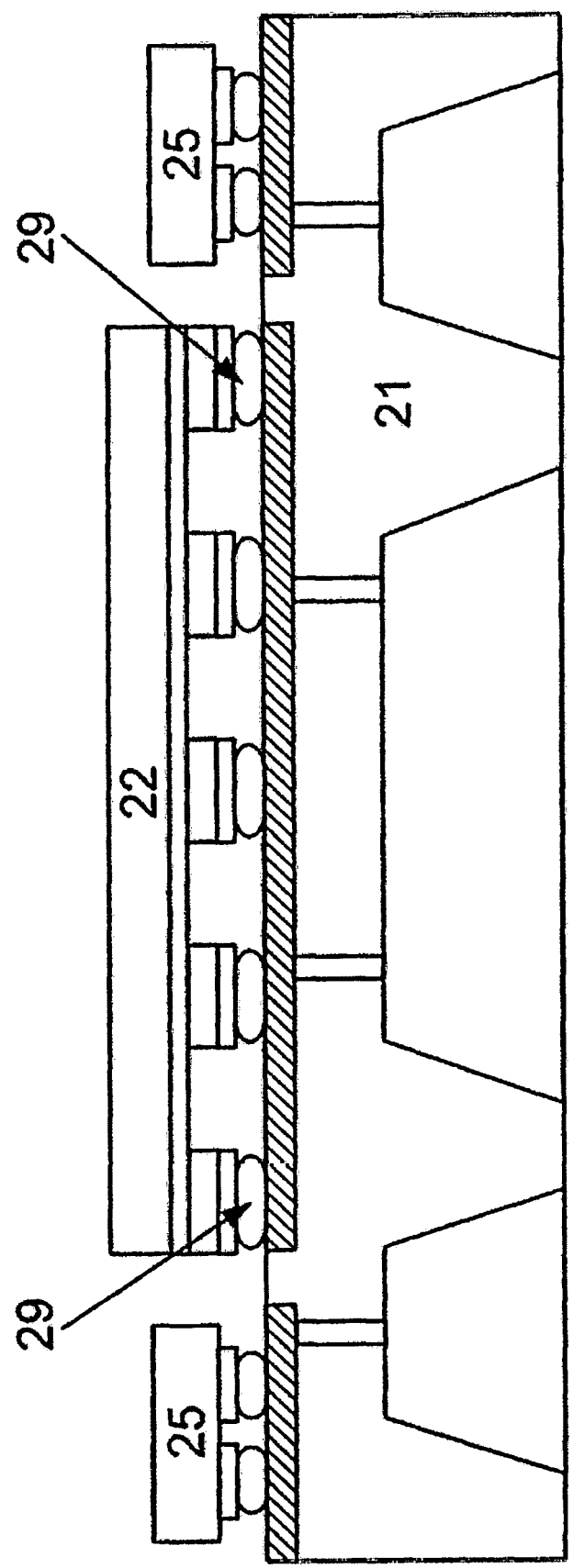

FIG. 8F illustrates the formation of semiconductor power switches (25). The semiconductor power switches (25) are flip-chip bonded to the substrate (21) through solder bumps (29). FIG. 8G illustrates the formation of the lighting component (22) (e.g., an SSL lighting/display components). In an exemplary embodiment, the lighting component (22) is an SSL lighting components, such as LED matrix, and is flip-chip bonded to the substrate (21) through solder bumps (29). In other embodiments (not depicted), it will be appreciated that the semiconductor power switches (25) and the lighting component (22) may be monolithically integrated with the substrate, without using solder bumps, through an epitaxial process.

A particular example of a lighting device incorporating the inventive principles described above may be found in the publication K. M. Lau et al., "Cost-effective and Eco-friendly LED System-on-a-Chip," China Solid State Lighting, Beijing, China (November 2013) (referred to herein as the "Lau publication"), which is incorporated herein by reference in its entirety.

The Lau publication further provides empirical data relating to components of the embedded passive component layer in exemplary embodiments of the device architecture discussed herein (e.g., backside silicon-embedded inductors (BSEIs) and integrated inductors with magnetic cores). Empirical data relating to flip-chip bonding is also discussed.

Embodiments of the inventive principles discussed herein are applicable in a variety of contexts. One application, as discussed above, is SSL lighting, where the lighting component (22) includes an SSL lighting component, and the overall device is an efficient and compact lighting device having a power system-on-chip architecture.

Another field of application relates to lighting devices having optical components. In one exemplary implementation, the lighting component (22) further includes an optical component such as a lens or an array of micro-lenses. As discussed in the Lau publication, the optical component may be bonded to the substrate using flip-chip technology or may be monolithically integrated with the substrate. Empirical data relating to an example where an InGaN LED with a sapphire surface having silica microspheres coated thereon shows that the addition of the optical component in these exemplary devices can increase output and efficiency.

Other examples of fields of application are sensing devices, such as sensors for air and water pollutant, as well as intelligent traffic systems. In one exemplary embodiment, both these functions are served by a single intelligent traffic light device utilizing the power system-on-chip architecture discussed herein. Yet another example of a field of application is in visible light communications (VLC). A few examples of these applications will be discussed in further detail as follows:

Intelligent Traffic Light

Figure 9:
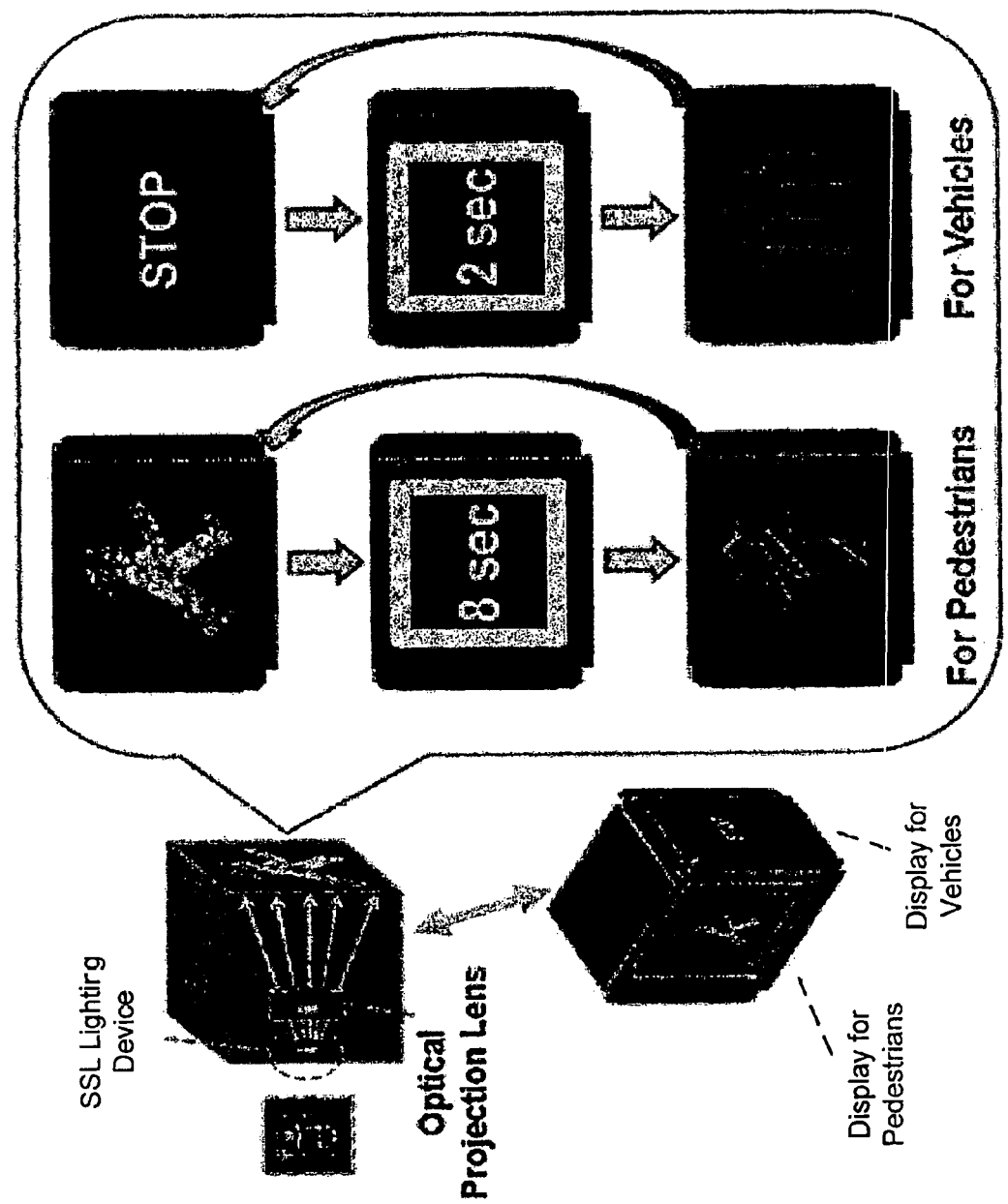
FIG. 9 depicts an exemplary traffic light device.

Conventional traffic lights, which require a large housing space with three separate lights (as well as separate lights for pedestrian "walk" and "don't walk" signals), consume a substantial amount of power and require substantial manufacturing costs. In an exemplary embodiment of the invention relating to traffic light applications, a small lighting device utilizing the power system-on-chip architecture described herein may be used in combination with an optical projection lens to achieve 2-in-1 (using a single lighting apparatus to show pedestrian signals), 3-in-1 (using a single lighting apparatus to show traffic signals), or even 5-in-1 (using a single lighting apparatus to show both pedestrian signals and traffic signals) traffic light devices that are efficient and cost-effective. An exemplary traffic light device is shown in FIG. 9, where the traffic light device is able to utilize one or two small lighting devices and one or two optical projection lens to provide a relatively more compact traffic light.

Intelligent traffic light devices may further include components allowing for pollutant sensing and visible light communications (VLC) as discussed below.

Pollutant Sensing

In embodiments of the invention relating to pollutant sensing, photonic sensors may be embedded in (or replace) the lighting component in the bonded layer of the power system-on-chip architecture. Optical excitation, signal detection and processing, as well as optical data communications, are performed by the device while it operates in its normal functional mode. Apart from simply sampling ambient light level, the device functions through measuring scattering, absorption and/or fluorescence of target substances as required for air or water pollution monitoring. Such devices can be deployed in large numbers for collecting a wide range of data including ambient light intensity for performing active lighting control and relative concentrations of pollutants in different districts.

In one example, the device contains a flip-chip bonded LED array. The LED array is individually modulated, and radiation through the air will be collected by on-chip detectors embedded in another LED light within a reasonable distance. With the appropriate signal processing, the signal processing circuit will output the absorption and scattering level for the surrounding area, indicating the presence (or absence) of pollutants.

An example of deployment of pollutant sensing using the intelligent traffic lighting device discussed above is provided in FIG. 10. A pair of opposite facing pedestrian traffic lights offers a suitable sensor deployment scenario, as the traffic lights are at the appropriate height and they are networked by the transportation department. As a result, the traffic lights can provide pollutant concentration mapping and time-correlated data.

The lighting device in sensing applications has the capability to modulate different color light source, and thus enables the development of a photonic source and detector pair to perform both narrow band and broad band sensing for air pollutants. Differential optical absorption spectroscopy (DOAS) is applied to sense chemical pollutants in the air, while broadband scattering measurement is used to sense the aerosols. The particulate matter (PM) in the path will scatter the light, while the chemical pollutants will absorb the light. The absorption and scattering in spherical coordinates can be characterized in Eqn. 1 below:

$$\frac{dI(\lambda)}{ds} = -\varepsilon_a(\lambda)I(\lambda) - \left[\varepsilon_s(\lambda)I(\lambda) - \varepsilon_s(\lambda)\int_0^\pi \int_0^{2\pi} I(\lambda, \vartheta, \phi)\frac{S(\vartheta, \phi)}{4\pi} d\phi \cdot \sin\vartheta d\vartheta\right] \quad (1)$$

The first term is due to the absorption. The second term is due to the scattering. The absorption coefficients $\varepsilon_a(\lambda)$ and the scattering coefficients $\varepsilon_s(\lambda)$ are both proportional to the target molecule concentrations and depends on the light wavelength. Therefore, by measuring the attenuation components at different wavelengths, various pollutant concentrations can be estimated.

The scattering in the air mainly follows the Rayleigh scattering and Mie scattering, which affects broadband light spectrum. On the other hand, chemical pollutants only absorb narrowband light. Therefore, effects of different pollutants can be separated from the received light spectrum. Within the visible light spectrum of the LED source, concentrations of major chemical pollutants such as $O_3$ and $NO_x$ can be measured. The typical air extinction coefficient ranges from 0.01 km$^{-1}$ in pollution-free air to 1 km$^{-1}$ in extremely polluted air. For example, with ~20 m separation between a source and detector pair, the air path attenuation can range between 0.02% and 2%. Given that the typical LED traffic light intensity is about 1500-2000 lumen, after the radiation losses, the estimated received light intensity at the detector is around 0.4 lux. At the same time, the background sun light intensity can be as high as 10 klux. A typical photodiode can provide 0.5 A/W responsivity. So, when used as the detection device, it will provide 270-pA signal photocurrent and 7-μA sunlight photocurrent. The slow and irregularly changing sunlight intensity can be cancelled using a feedback loop for background "noise" calibration. One approach is to modulate the source LED with a specific "signature frequency," e.g. 100 kHz, in order to facilitate synchronized lock-in detection at the receiver.

In addition to performing signal conditioning in the electrical domain, optical filters may also be utilized to further remove unwanted background sunlight. In the sensor design, optical components may take the form of customized plastic optics ready for direct mounting on the lighting device. Specific components may be used to perform beam collimation, control of field of view and spectral analysis, either through interference filtering or grating dispersion on the outgoing and return optical radiation. Further, embedded signal processing ICs for sensing data recovery may be implemented to ensure that the final device fits in with other functionalities of the traffic light system.

Visible Light Communications (VLC)

In further embodiments, an LED light signal generated by a lighting device having a power system-on-chip architecture may be modulated with information for visible light communications.

Figure 10:
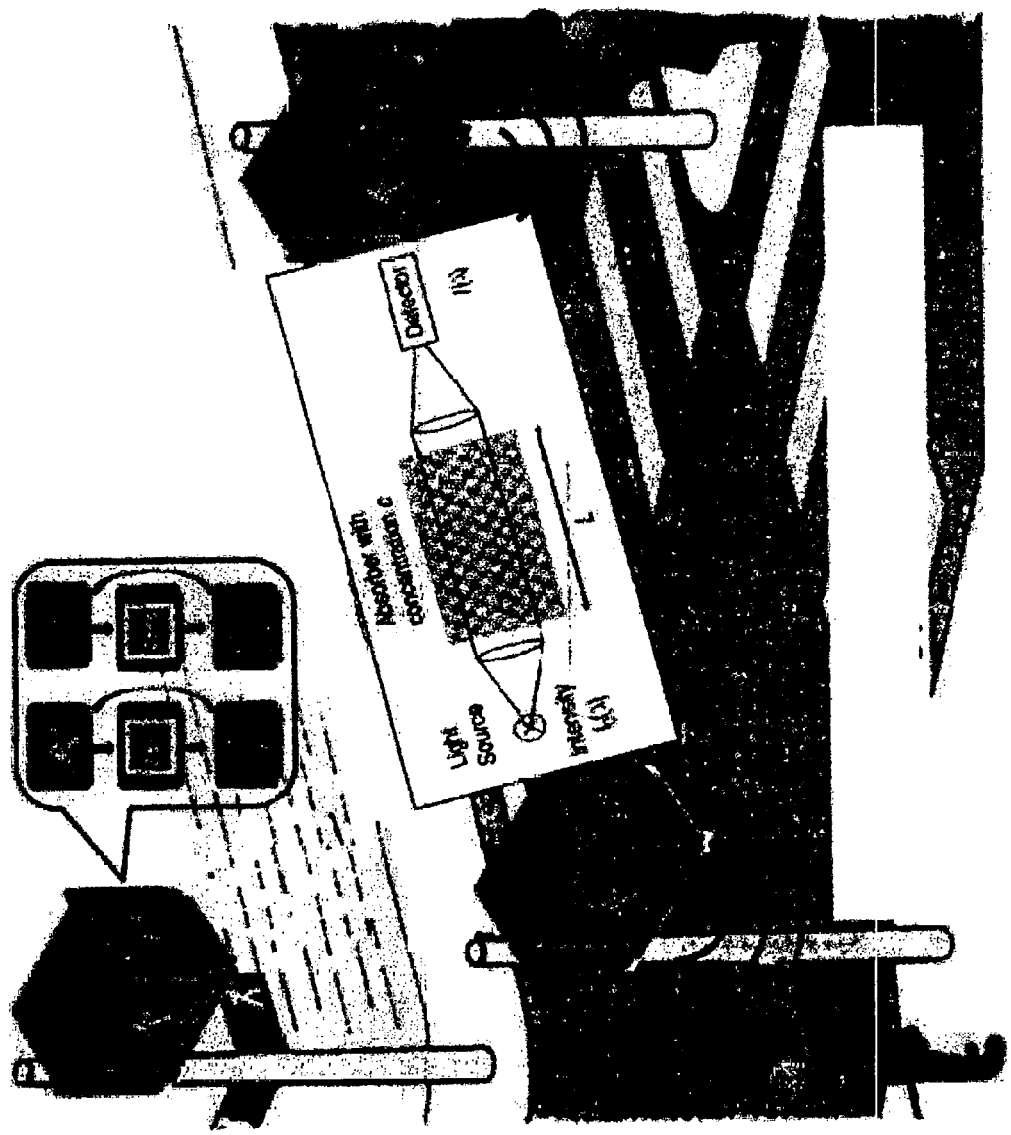
FIG. 10 depicts an example of deployment of pollutant sensing using the intelligent traffic lighting device.

In one example, intelligent traffic lighting devices as discussed above are equipped with appropriate signal processing and control circuitry to allow for broadcasting of data (such as pollution and traffic data), such that mobile devices equipped with photonic wireless transceivers are able to communicate wirelessly with the intelligent traffic light (as illustrated in FIG. 10 by the two individuals carrying mobile devices).

Although conventionally, VLC consumes a large amount of energy and is thus cost-prohibitive for many applications, embodiments of the invention, which use GaN LED pixels in SSL lighting devices utilizing the power system-on-chip architecture described herein, are able to achieve VLC with substantially less loading. By modulating each pixel, or pixel group, of the lighting device with different drive frequencies, an orthogonal frequency diffusion multiplexing (OFDM) transmitter can be readily realized. In essence, the light (transmitted power) combining occurs in the free space because all the data steam uses the same carrier, namely the visible light. The drive current for each LED acts as the sub-carrier signal in the OFDM transmitter. A high-speed serial data stream is first separated, i.e. deserialized, into parallel streams to modulate each sub-carrier, which in turn is used to modulate each LED pixel, or pixel group. Since the drive current must maintain a constant DC level to keep the light intensity stable (not data-dependent), phase-shift keying or Manchester coding may be employed to keep a constant RMS level of the sub-carrier (drive current). The VLC transmitter based on matrix circuits for individual modulating each pixel can readily be implemented in standard CMOS to attain good energy efficiency. Furthermore, since the same VLC transmitter can also function as the environmental sensor source signal generator, both the electronic hardware and the energy for operation are reused. In the sensor mode, the pixels can be grouped together to increase the signal intensity when the background sunlight is strong or to cover more air sample volume. As, previously mentioned, "signature" modulation frequencies for lock-in synchronization may be employed to facilitate the suppression of the background sunlight. The matrix circuits thus offer a fitting circuit platform to implement this scheme on the source side, as each pixel can be driven at different frequencies.

For the receiver, visible light can be detected using either a photodiode or a CMOS image sensor depending on the intended deployment conditions such as distance from transmitter, line of sight, and background light level. In particular, in an exemplary embodiment, a standard trans-impedance amplifier (TIA) with the front-end photodiode either flip-chipped onto the CMOS IC "base" layer, or embedded within the CMOS substrate, is used to convert the incoming current signal from the photodiode to a voltage for further signal processing. The close proximity of the photodiode and the TIA will reduce the parasitic loadings that are otherwise present in discrete implementation. As a result, the noise level of the receiver front-end (RFE) should be lower, as better shielding can be added without introducing unacceptable loading effects.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and "at least one" and similar referents in the context of describing the invention (especially in the context of the following claims) are to be construed to cover both the singular and the plural, unless otherwise indicated herein or clearly contradicted by context. The use of the term "at least one" followed by a list of one or more items (for example, "at least one of A and B") is to be construed to mean one item selected from the listed items (A or B) or any combination of two or more of the listed items (A and B), unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

The invention claimed is:

1. A lighting device, comprising a substrate, integrated circuits, embedded passive components, and a lighting component, the device being arranged in an architecture comprising:
    an integrated circuits layer comprising the integrated circuits, wherein the integrated circuits layer is integrated on a first side of the substrate;
    an embedded passive components layer comprising the embedded passive components, wherein the embedded passive components are embedded in grooves formed in the substrate and wherein the embedded passive components are connected to the integrated circuits through vias in the substrate; and
    a bonded layer, comprising the lighting component, the lighting component being connected to the integrated circuit layer through flip-chip bonding or monolithic integration.

2. The lighting device of claim 1, wherein the integrated circuits of the integrated circuits layer comprise signal processing and control circuits.

3. The lighting device of claim 1, wherein the integrated circuits of the integrated circuits layer comprise power management control circuits.

4. The lighting device of claim 1, wherein the embedded passive components comprise at least one of the group consisting of: inductors, transformers, and capacitors.

5. The lighting device of claim 1, wherein the integrated circuits of the integrated circuits layer are connected to the embedded passive components of the embedded passive components layer through vias disposed in the substrate.

6. The lighting device of claim 1, wherein the bonded layer further comprises a semiconductor switch, wherein the semiconductor switch is connected to the integrated circuit layer through flip-chip bonding or monolithic integration.

7. The lighting device of claim 6, wherein the semiconductor switch is a silicon-based power transistor or a compound power transistor.

8. The lighting device of claim 1, wherein the lighting component is a GaN-based LED array.

9. The lighting device of claim 1, wherein the device further comprises a thermal routing structure disposed in the substrate.

10. The lighting device of claim 1, wherein the lighting component is connected to the integrated circuit layer through flip-chip bonding, and the device further comprises:
    an under-fill between the lighting component of the bonded layer and the integrated circuits layer.

11. The lighting device of claim 1, wherein the lighting component comprises an array of micro-lenses.

12. The lighting device of claim 1, wherein the lighting device further comprises a pollutant sensor, and the lighting device is part of an intelligent traffic light system.

13. A method for fabricating a lighting device, the method comprising:
    forming integrated circuits on a first side of a substrate;
    etching vias in the substrate;
    etching grooves on a second side of the substrate;
    forming passive components in the grooves, wherein the passive components in the grooves are connected to the integrated circuits through the vias; and
    forming a lighting component connected to the integrated circuits on the first side of the substrate, the lighting component being connected to the integrated circuits on the first side of the substrate through flip-chip bonding or monolithic integration.

14. The method of claim 13, wherein the lighting component is connected to the integrated circuits through monolithic integration using an epitaxial process.

15. The method of claim 13, further comprising:
    forming a semiconductor switch connected to the integrated circuits on the first side of the substrate, wherein the semiconductor switch is connected to the integrated circuits on the first side of the substrate through flip-chip bonding or monolithic integration.

16. The method of claim 15, wherein the semiconductor switch is connected to the integrated circuits through monolithic integration using an epitaxial process.

17. The method of claim 13, further comprising:
    forming an under-fill between the lighting component and the integrated circuits.

18. The method of claim 13, wherein the lighting component is a GaN-based LED array.

19. The method of claim 13, further comprising:
    forming a thermal routing structure disposed in the substrate.

20. The method of claim 13, wherein the lighting component comprises an array of micro-lenses.

* * * * *